(12) United States Patent
Kajigaya

(10) Patent No.: US 12,334,473 B2
(45) Date of Patent: Jun. 17, 2025

(54) STACKED SEMICONDUCTOR, WAFER STACK, METHOD OF MANUFACTURING STACKED SEMICONDUCTOR, ASSISTANCE DEVICE, AND PROGRAM

(71) Applicant: UltraMemory Inc., Tokyo (JP)

(72) Inventor: Kazuhiko Kajigaya, Tokyo (JP)

(73) Assignee: ULTRAMEMORY INC., Tokyo (JP)

( * ) Notice: Subject to any disclaimer, the term of this patent is extended or adjusted under 35 U.S.C. 154(b) by 644 days.

(21) Appl. No.: 17/765,997

(22) PCT Filed: Oct. 9, 2019

(86) PCT No.: PCT/JP2019/039808
§ 371 (c)(1),
(2) Date: Apr. 1, 2022

(87) PCT Pub. No.: WO2021/070281
PCT Pub. Date: Apr. 15, 2021

(65) Prior Publication Data
US 2022/0310450 A1    Sep. 29, 2022

(51) Int. Cl.
*G11C 11/00* (2006.01)
*G11C 7/10* (2006.01)
(Continued)

(52) U.S. Cl.
CPC ........ *H01L 25/0657* (2013.01); *G11C 7/1006* (2013.01); *H10B 12/01* (2023.02); *G11C 7/1051* (2013.01)

(58) Field of Classification Search
CPC ............................ G11C 7/1006; G11C 7/1051
See application file for complete search history.

(56) References Cited

U.S. PATENT DOCUMENTS 8,381,059 B2 * 2/2013 Resnick .............. G06F 11/2053
                                                      710/316
8,569,874 B2 * 10/2013 Colgan .................. G11C 5/025
                                                      257/730
(Continued)

FOREIGN PATENT DOCUMENTS

JP      200323138 A    1/2003
JP     2005123500 A    5/2005
(Continued)

OTHER PUBLICATIONS

Notification of Reasons for Refusal issued in the JP Patent Application No. 2023-083650, mailed on May 28, 2024.

*Primary Examiner* — Pho M Luu
(74) *Attorney, Agent, or Firm* — Muncy, Geissler, Olds & Lowe, P.C.

(57) ABSTRACT

A laminated semiconductor which enables curbing of manufacturing cost; a wafer laminate; a method for manufacturing the laminated semiconductor; an assistance device; and a program. This laminated semiconductor formed by laminating a plurality of chips is provided with a logic chip; and a memory part that is stacked on the logic chip and has at least one memory chip communicable with the logic chip. The memory chip has at least two memory bodies that have memory circuits and that are arranged side by side in a direction intersecting the stacking direction; and a connection part which is provided with a prescribed width between the memory bodies and which connects the memory bodies arranged side by side.

11 Claims, 10 Drawing Sheets

(51) Int. Cl.
*H01L 25/065* (2023.01)
*H10B 12/00* (2023.01)

(56) References Cited

U.S. PATENT DOCUMENTS

| | | |
|---|---|---|
| 2003/0015792 A1 | 1/2003 | Urakawa |
| 2007/0023887 A1 | 2/2007 | Matsui |
| 2007/0058408 A1* | 3/2007 | Ruckerbauer .......... G11C 5/063 365/63 |

FOREIGN PATENT DOCUMENTS

| | | |
|---|---|---|
| JP | 200736104 A | 2/2007 |
| JP | 2010-507254 A | 3/2010 |
| JP | 2012524519 A | 10/2012 |
| JP | 201333999 A | 2/2013 |
| JP | 2013-182972 A | 9/2013 |
| JP | 201518870 A | 1/2015 |
| WO | WO2008/051415 A1 | 5/2008 |
| WO | WO-2010/086405 A1 | 8/2010 |

* cited by examiner

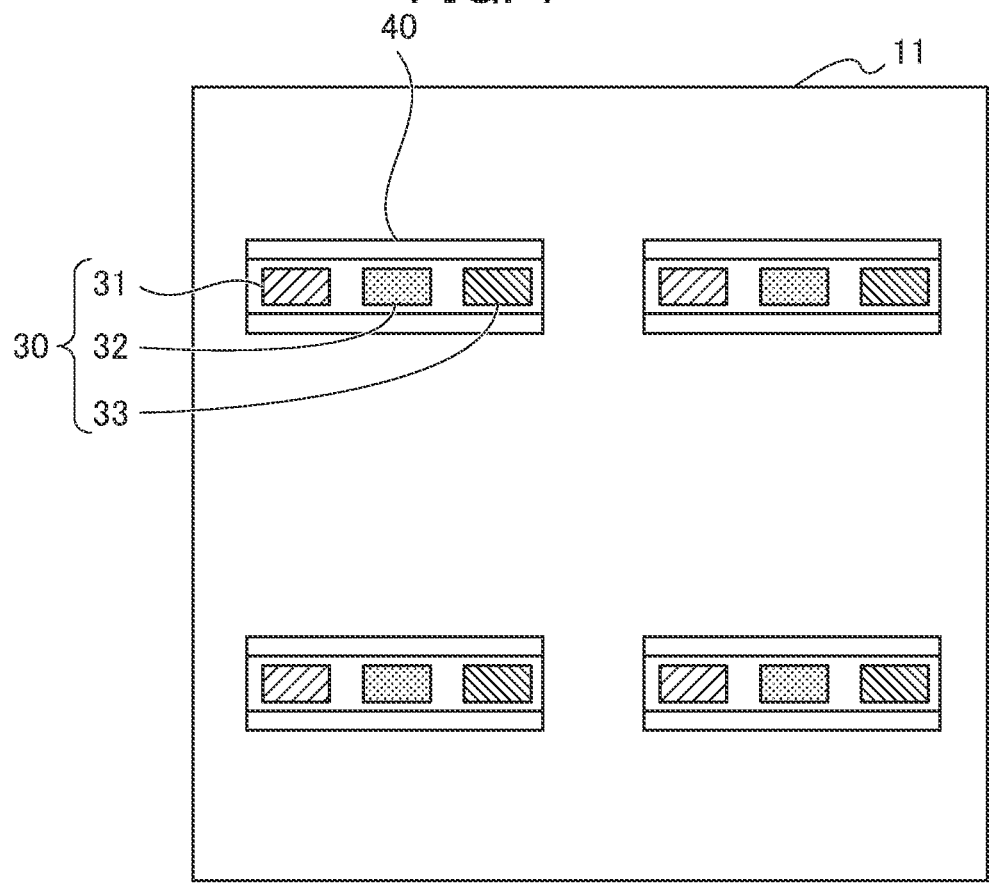
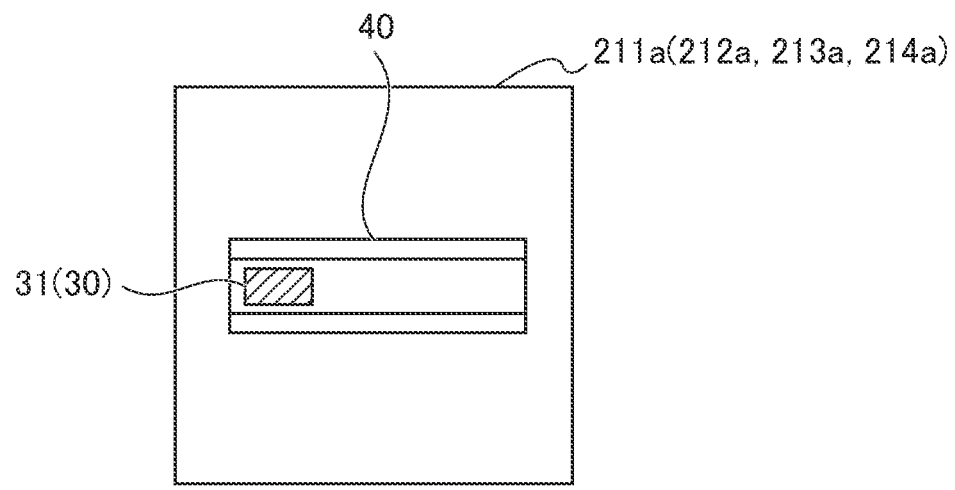

FIG. 15

| Size | Foot Print [mm²] | 1 Layer [Gb] | 2 Layer [Gb] | 4 Layer [Gb] |
|---|---|---|---|---|
| 2 x 1 | 8x4=32 | 4, 3, 1.2, 128 | 8, 6, 2.4, 256 | 16, 12, 4.8, 512 |
| 2 x 2 | 8x8=64 | 8, 6, 2.4, 256 | 16, 12, 4.8, 512 | 32, 24, 9.6, 1024 |
| 3 x 2 | 12x8=96 | 12, 9, 3.6, 384 | 24, 18, 7.2, 768 | 48, 36, 14.4, 1536 |
| 4 x 2 | 16x8=128 | 16, 12, 4.8, 512 | 32, 24, 9.6, 1024 | 64, 48, 19.2, 2048 |
| 3 x 3 | 12x12=144 | 18, 13.5, 5.4, 576 | 36, 27, 10.8, 1152 | 72, 54, 21.6, 2304 |

STACKED SEMICONDUCTOR, WAFER STACK, METHOD OF MANUFACTURING STACKED SEMICONDUCTOR, ASSISTANCE DEVICE, AND PROGRAM

TECHNICAL FIELD

The present invention is a stacked semiconductor, a wafer stack, a method of manufacturing a stacked semiconductor, an assistance device, and a program.

BACKGROUND ART

Conventionally, volatile memory (RAM) such as DRAM (Dynamic Random Access Memory) as a storage device has been known. An increase in the performance and increase in capacity to endure the increase in data volume of arithmetic units (hereinafter referred to as logic chips) are required in DRAM. Therefore, a reduction in the size of memory (memory cell arrays and memory chips) and an increase in capacity due to planar expansion of cells have been attempted. On the other hand, due to weak nature to noise caused by the reduction in size and an increase in die area, this type of capacity increase has reached a limit.

Recently, techniques have been developed for realizing a large-capacity memory by stacking a plurality of planar memory to provide a three-dimensional memory (3D). In addition, a device in which a plurality of die stacks (DRAM) are stacked on an interface die has been proposed (see, for example, Japanese Unexamined Patent Application (Translation of PCT Application), Publication No. 2013-524519).
Patent Document 1: Japanese Unexamined Patent Application (Translation of PCT Application), Publication No. 2013-524519

DISCLOSURE OF THE INVENTION

Problems to be Solved by the Invention

In Japanese Unexamined Patent Application (Translation of PCT Application), Publication No. 2013-524519, first, four die stacks are manufactured. Thereafter, each of the four die stacks is stacked on one interface die while positioning. For this reason, assembly time is increased, resulting in high manufacturing costs.

It is an object of the present invention to provide a stacked semiconductor, a wafer stack, a method of manufacturing a stacked semiconductor, an assistance device, and a program that can reduce the manufacturing cost.

Means for Solving the Problems

An exemplary embodiment of the present invention is directed to a stacked semiconductor including a stack of a plurality of chips including: a logic chip; and a memory unit stacked on the logic chip and including at least one memory chip that is communicable with the logic chip, in which the memory chip includes at least two memory bodies each having a memory circuit and provided in parallel in a direction intersecting a stacking direction, and a connecting portion provided between the memory bodies in a predetermined width and connecting the memory bodies provided in parallel.

Furthermore, the stacked semiconductor may further include a communication unit provided across the logic chip and the memory chip in the stacking direction.

Furthermore, the memory chip may include a plurality of memory chips, and the plurality of memory chips may be stacked such that the memory bodies provided in parallel of the memory chip are superimposed on memory bodies of one other memory chip in the stacking direction, and the communication unit may be provided in an aligned manner in the stacking direction in each of the logic chip and the plurality of memory bodies.

Furthermore, each of the memory bodies may be identical in type with other of the memory bodies provided in parallel.

Furthermore, each of the memory bodies may be different in type from the other memory bodies to be stacked.

Furthermore, the plurality of memory chips may include a first memory chip including a first memory body of a predetermined type, and a second memory chip including a second memory body of a type different from that of the first memory chip, and the communication unit may include a first communication unit provided in the logic chip and the first memory body, and a second communication unit provided in the logic chip and the second memory body.

Furthermore, the first communication unit may be provided at a position different from that of the second communication unit in a direction intersecting the stacking direction.

Furthermore, the logic chip and the memory chip may respectively include power supplies provided in a superimposed manner.

Furthermore, an exemplary embodiment of the present invention is directed to a wafer stack including: a logic wafer including logic chips described above arranged in a matrix; and memory wafers each including memory bodies described above arranged in a matrix, and stacked on the logic wafer.

Furthermore, an exemplary embodiment of the present invention is directed to a method of manufacturing a stacked semiconductor including a stack of a plurality of chips, including: a stacking step including stacking memory wafers each including a plurality of memory bodies arranged in a matrix, and a logic wafer including a plurality of logic chips that are arranged in a matrix and are respectively superimposed on the memory bodies, to form a wafer stack; a partition determination step including determining a memory partition including a combination of at least two memory bodies among the memory bodies and one logic chip among the logic chips; and a dicing step including dicing the wafer stack according to the memory partition determined.

Furthermore, the stacking step may further include stacking a plurality of memory wafers each including the memory body of different type provided therein.

Furthermore, an exemplary embodiment of the present invention is directed to an assistance device that executes assistance for dividing a wafer stack in which memory wafers including a plurality of memory bodies arranged in a matrix, and a logic wafer including a plurality of logic chips arranged in a matrix provided therein and arranged in a superimposed manner on the memory bodies, respectively, according to a plurality of orders acquired, the assistance device including: an order information acquisition unit that acquires a plurality of pieces of order information including a number of the memory bodies; an arrangement information acquisition unit that acquires arrangement information indicating arrangement positions of the memory bodies; and a partition determination unit that determines partitions of memory chips including the plurality of memory bodies and the logic chip based on the order information and the arrangement information acquired.

Furthermore, an exemplary embodiment of the present invention is directed to a non-transitory computer-readable storage medium storing a program that is executed by a computer that comprises a processor to control an assistance device that executes assistance for dividing a wafer stack in which memory wafers including a plurality of memory bodies arranged in a matrix, and a logic wafer including a plurality of logic chips arranged in a matrix provided therein and arranged in a superimposed manner on the memory bodies, respectively, according to a plurality of orders acquired, the program being executable to cause the computer to perform operations including:

an order information acquisition unit that acquires a plurality of pieces of order information including a number of the memory bodies; an arrangement information acquisition unit that acquires arrangement information indicating arrangement positions of the memory bodies; and a partition determination unit that determines partitions of memory chips including the plurality of memory bodies and the logic chip based on the order information and the arrangement information acquired.

Effects of the Invention

According to the present invention, it is possible to provide a stacked semiconductor, a wafer stack, a method of manufacturing a stacked semiconductor, an assistance device, and a program that can reduce the manufacturing cost.

BRIEF DESCRIPTION OF THE DRAWINGS

FIG. 7 is a plan view showing a logic chip of the stacked semiconductor of the first embodiment;

FIG. 8 is a plan view showing a first communication unit in a memory body of the stacked semiconductor of the first embodiment;

FIG. 15 is a table showing the relationship between the size and capacity of the stacked semiconductor of the modification example.

PREFERRED MODE FOR CARRYING OUT THE INVENTION

Figure 1:
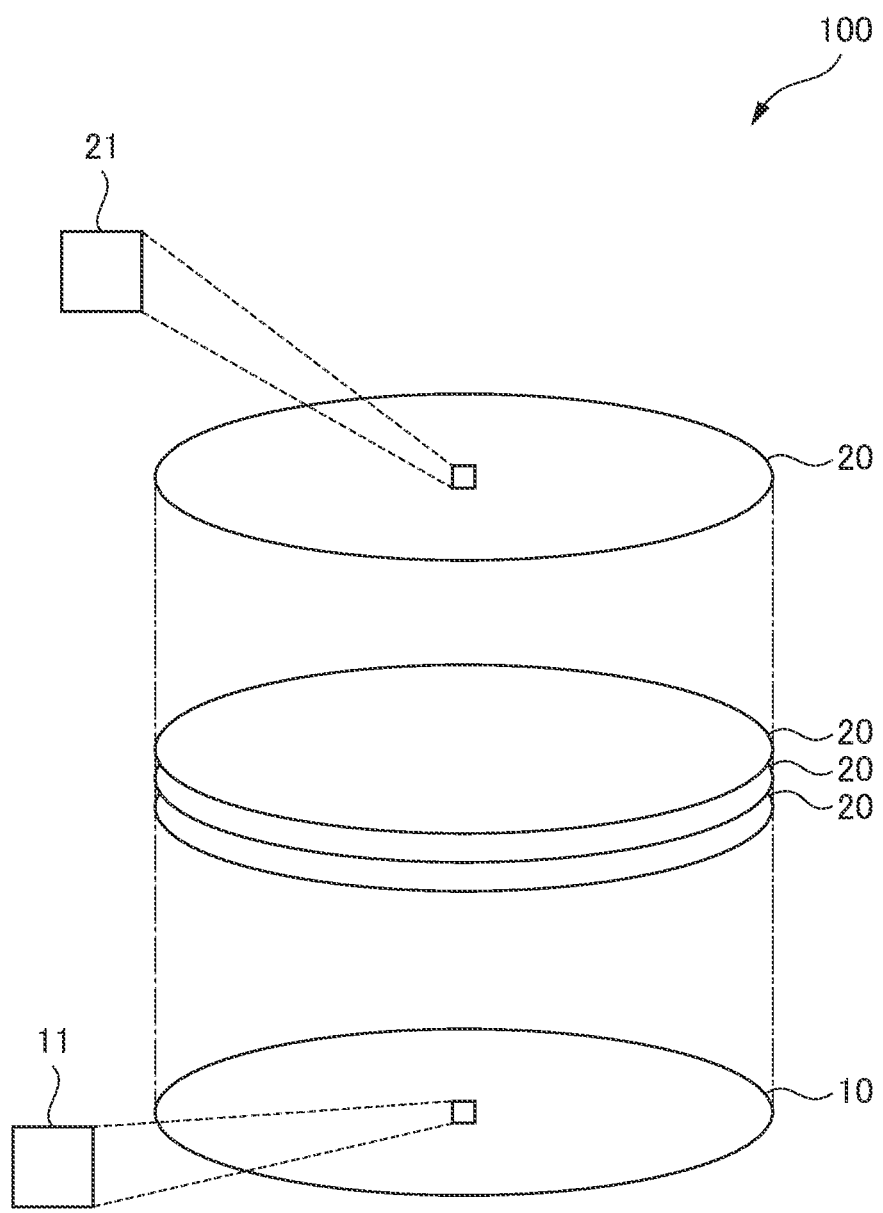
FIG. 1 is a perspective view showing a logic wafer and a memory wafer of a wafer stack of a first embodiment of the present invention.
Figure 2:
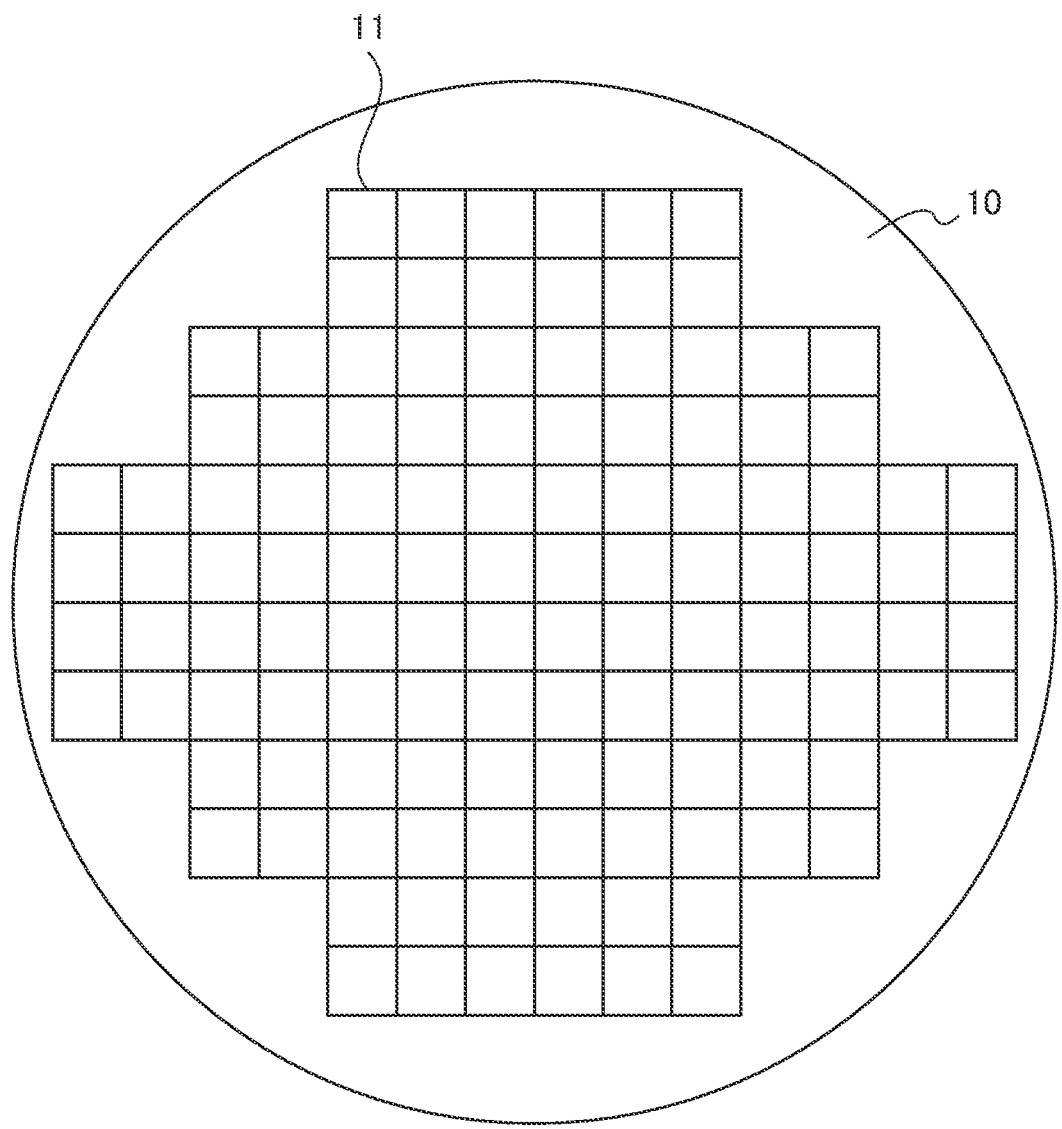
FIG. 2 is a plan view showing a logic wafer of the first embodiment.
Figure 3:
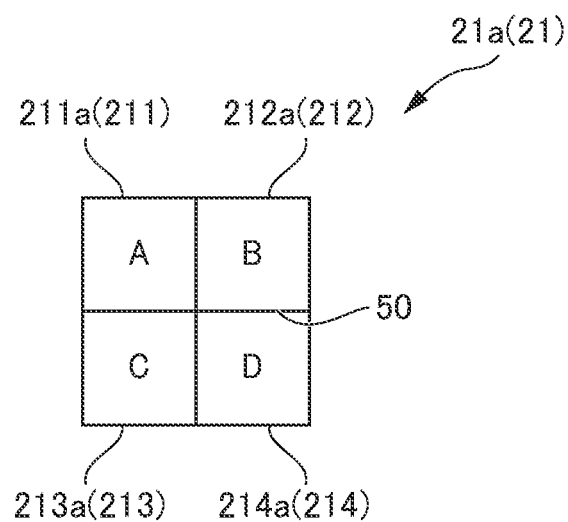
FIG. 3 is a plan view showing a first memory chip of a stacked semiconductor of the first embodiment.
Figure 4:
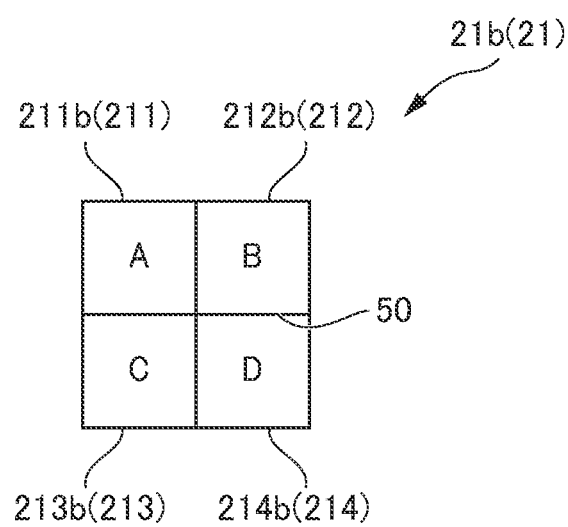
FIG. 4 is a plan view showing a second memory chip of the stacked semiconductor of the first embodiment.
Figure 5:
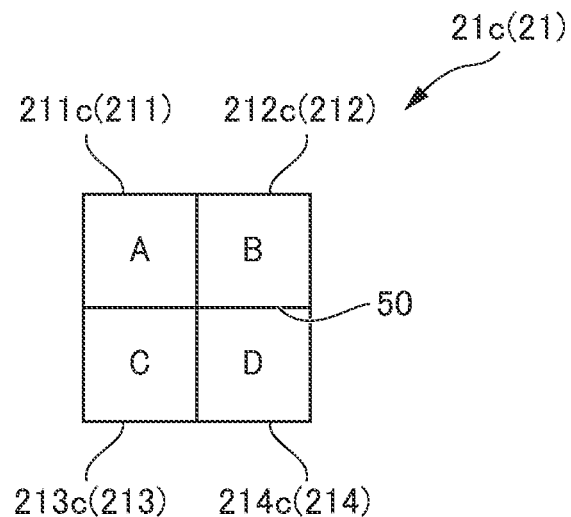
FIG. 5 is a plan view showing a third memory chip of the stacked semiconductor of the first embodiment.
Figure 6:
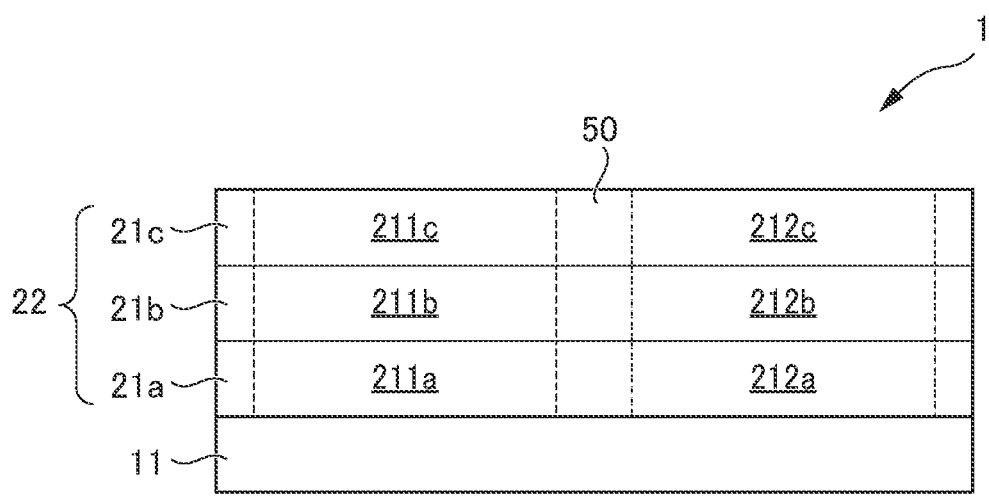
FIG. 6 is a side view showing the stacked semiconductor of the first embodiment.

Hereinafter, a stacked semiconductor 1, a wafer stack 100, an assistance device 200, and a program according to each embodiment of the present invention will be described with reference to FIGS. 1 to 15. The stacked semiconductor 1 according to each embodiment is, for example, a module obtained by stacking a logic chip 11 and a memory chip 21, as shown in FIGS. 1 and 6. The stacked semiconductor 1 is obtained by dicing the wafer stack 100 obtained by stacking a plurality of wafers. The stacked semiconductor 1 includes at least two of the memory bodies 211, 212, 213, and 214, each having a memory circuit provided in the memory chip 21, as shown in FIG. 3. It is possible for the stacked semiconductor 1 to obtain the stacked semiconductor 1 of different capacities by changing the number of memory bodies 211, 212, 213, and 214 included by changing the dicing position.

First Embodiment

Next, the stacked semiconductor 1 and the wafer stack 100 according to the first embodiment of the present invention will be described with reference to FIGS. 1 to 10.

The wafer stack 100 is formed by stacking a plurality of wafers. The wafer stack 100 includes, for example, a logic wafer 10 and memory wafers 20, as shown in FIG. 1.

The logic wafer 10 is, for example, a silicon substrate, and has a disc shape. As shown in FIG. 2, the logic wafer 10 includes a plurality of logic chips 11 arranged in a matrix. The logic chip 11 will be described later.

The memory wafers 20 are each a silicon substrate, for example, and has a disc shape having the same or substantially the same diameter as the logic wafer 10. The memory wafers 20 are stacked on the logic wafer 10. In this embodiment, the plurality of memory wafers 20 are provided and stacked on the logic wafer 10. The memory wafers 20 are stacked, for example, on the logic wafer 10 by a wafer bonding technique such as surface-activated bonding or hydrophilic bonding. Also, the memory wafer 20 are bonded to each other by a wafer bonding technique such as surface-activated bonding or hydrophilic bonding. The memory wafers 20 each include a plurality of memory chips 21 arranged in a matrix including two or more memory bodies of a unit size to be described later. The memory chips 21 will be described later.

Next, a description will be given of the stacked semiconductor 1. As shown in FIGS. 3 to 6, the stacked semiconductor 1 includes a stack of a plurality of chips. As shown in FIGS. 3 to 10, the stacked semiconductor 1 includes a logic chip 11, a memory unit 22, a communication unit 30, and a power supply unit 40. In the present embodiment, the stacked semiconductor 1 has a rectangular shape in a plan view, and has the same size or substantially the same size as the logic chip 11 in a plan view.

The logic chip 11 is, for example, a chip having a rectangular shape in a plan view. In each of the logic chips 11, for example, a memory controller and a memory interface, a logic circuit, a power supply circuit, an external interface, and the like are formed. The logic chips 11 each have a size of, for example, 8×4 (mm2) to 12×12 (mm2). In the present embodiment, the logic chips 11 each have a size of 8×8 (mm2).

The memory unit 22 includes, for example, at least one memory chip 21. The memory unit 22 is stacked on the logic chip 11. The memory unit 22 is communicable with the logic chip 11.

The memory chip 21 has a rectangular shape in a plan view. The memory chip 21 includes at least two memory bodies 211, 212, 213, and 214, and a connecting portion 50.

The memory bodies 211, 212, 213, and 214 has a rectangular shape in a plan view, for example. The memory bodies 211, 212, 213, and 214 each have a memory circuit. The memory bodies 211, 212, 213, and 214 are provided in parallel in a direction intersecting the stacking direction.

The connecting portion 50 is provided between the memory bodies 211, 212, 213, and 214 at a predetermined width. The connecting portion 50 connects the plurality of memory bodies 211, 212, 213, and 214 arranged in parallel to each other. The connecting portion 50 includes, for example, a region left without dicing among the diceable region provided in the memory wafer 20.

According to the above memory chip 21, the memory bodies 211, 212, 213, and 214, and the connecting portion 50, the memory bodies 211, 212, 213, and 214 each have a predetermined unit size (4×4 mm2 in the present embodiment). In the present embodiment, this predetermined unit size is represented as 1×1 size. The memory bodies 211, 212, 213, and 214 are, for example, any type of memory such as DRAM, SRAM, flash memory, MRAM, ReRAM, FeRAM, and PCRAM. The memory bodies 211, 212, 213, and 214 are communicable with the logic chip 11. In the present embodiment, for example, as shown in FIG. 3, the memory bodies 211, 212, 213, and 214 of 1×1 size constitute a memory chip 21 of 2×2 size (8×8 mm2) with four memory bodies (A, B, C, and D). Furthermore, the memory chip 21 is stacked on the logic chip 11 of 8×8 mm2 (2×2 size) shown in FIG. 2. The memory chip 21 has the four memory bodies 211, 212, 213 and 214, and the connecting portion 50 which extends in the in-plane direction, and is stacked on the logic chip 11. That is, the memory chip 21 includes the memory bodies 211, 212, 213, and 214 of four unit sizes. Sixteen memory bodies 211, 212, 213, and 214 are arranged on one reticle (e.g., 4×4 size). In the present embodiment, as shown in FIGS. 3 to 6, the memory unit 22 includes, for example, a first memory chip 21*a* having first memory bodies 211*a*, 212*a*, 213*a* and 214*a* of a predetermined type, a second memory chip 21*b* having second memory bodies 211*b*, 212*b*, 213*b* and 214*b* different from the first memory bodies 211*a*, 212*a*, 213*a* and 214*a*, and a third memory chip 21*c* having third memory bodies 211*c*, 212*c*, 213*c* and 214C different from the first memory bodies 211*a*, 212*a*, 213*a* and 214*a*, and the second memory bodies 211*b*, 212*b*, 213*b* and 214*b*. The first memory chip 21*a*, the second memory chip 21*b*, and the third memory chip 21*c* may be provided in different predetermined positions in the same memory wafer 20, or may be provided in different memory wafers 20. FIG. 6 shows a cross-sectional view of the stacked semiconductor 1 in which the first memory chip 21*a*, the second memory chip 21*b*, and the third memory chip 21*c* are stacked in this order on the logic chip 11.

The communication unit 30 is provided across the logic chip 11 and the memory chip 21 in the stacking direction. More specifically, the communication unit 30 is disposed as a stacked portion of one region of the logic chip 11 and one region of the memory chip 21 in the stacking direction. For example, as shown in FIGS. 7 to 10, the communication unit 30 is provided as a region different for each type of the memory chip 21 stacked on the logic chip 11. The communication unit 30 includes a first communication unit 31, a second communication unit 32, and a third communication unit 33. In each of the communication units 30, a communication path (not shown) for performing communication in the stacking direction between the logic chip 11 and the memory chip 12 is provided.

The first communication unit 31 is disposed in the logic chip 11 and the first memory bodies 211*a*, 212*a*, 213*a* and 214*a*. As shown in FIGS. 7 and 8, the first communication unit 31 is disposed on one end side of the communication unit 30.

Figure 9:
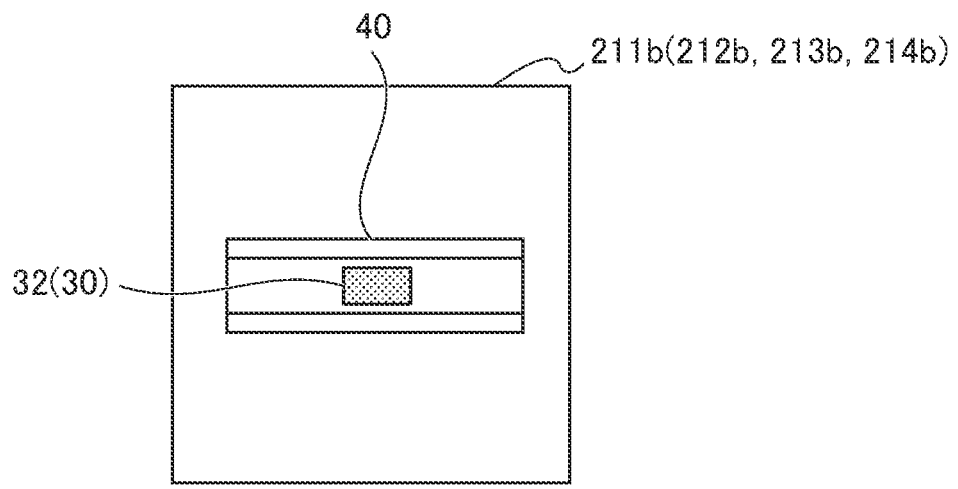
FIG. 9 is a plan view showing a second communication unit in the memory body of the stacked semiconductor of the first embodiment.

The second communication unit 32 is disposed in the logic chip 11 and the second memory bodies 211*b*, 212*b*, 213*b* and 214*b*. As shown in FIGS. 7 and 9, the second communication unit 32 is disposed at the middle of the communication unit 30. That is, the second communication unit 32 is disposed at a different position from the first communication unit 31 in a direction intersecting the stacking direction.

Figure 10:
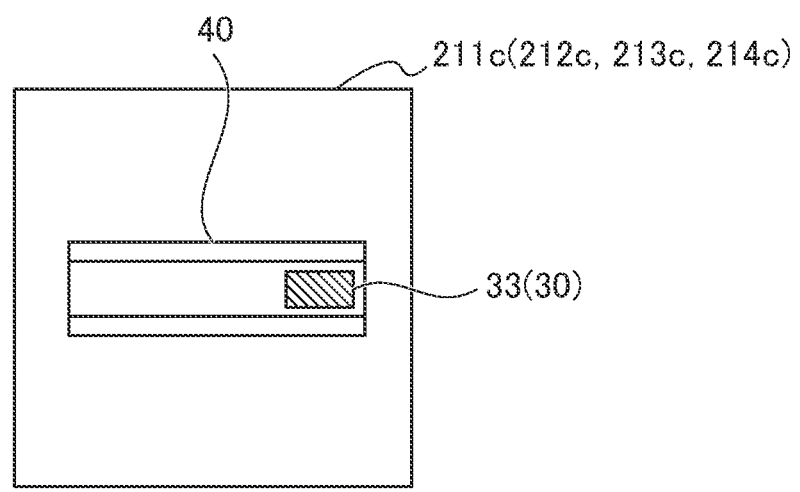
FIG. 10 is a plan view showing a third communication unit in the memory body of the stacked semiconductor of the first embodiment.

The third communication unit 33 is disposed in the logic chip 11 and the third memory bodies 211*c*, 212*c*, 213*c* and 214*c*. As shown in FIGS. 7 and 10, the third communication unit 33 is disposed on the other end side of the communication unit 30. That is, the third communication unit 33 is disposed at a position different from the first communication unit 31 and the second communication unit 32 in a direction intersecting the stacking direction. Thus, even when three kinds of memory chips 21 including the first memory chip 21*a*, the second memory chip 21*b*, and the third memory chip 21*c* are stacked on the logic chip 11, each memory chip 21 can communicate with the logic chip 11 without disturbing the other memory chips 21. On the other hand, when only a plurality of first memory chips 21*a* are stacked on the logic chip 11, for example, the logic chip 11 may include only the first communication unit 31.

The power supply unit 40 extends in the stacking direction, and is shared as a power supply line of the first memory chip 21*a* (first memory bodies 211*a*, 212*a*, 213*a*, and 214*a*), the second memory chip 21*b* (second memory bodies 211*b*, 212*b*, 213*b*, and 214*b*), and the third memory chip 21*c* (third memory bodies 211*c*, 212*c*, 213*c*, and 214*c*). In this embodiment, TSV or the like for the power supply line extending in the stacking direction along the communication unit 30 is disposed in the power supply unit 40. Furthermore, the power supply units 40 may be arranged as a pair with the communication unit 30 interposed therebetween. Furthermore, the power supply units 40 may be arranged so as to surround the region of the communication unit 30, or may be disposed at a location (not shown) away from the communication unit 30.

Next, a method of manufacturing the stacked semiconductor 1 will be described. The method of manufacturing the stacked semiconductor 1 includes a stacking step, a dicing position determining step, and a dicing execution step.

First, the stacking step includes stacking the memory wafers 20 on which the memory chips 21 (the memory bodies 211, 212, 213, and 214) are arranged, on the logic wafer 10 on which the logic chips 11 are arranged. In the stacking step, the logic wafer 10 and the memory wafers 20 are stacked with the communication unit 30 and the power supply unit 40 aligned in the stacking direction. Furthermore, in the present embodiment, three memory wafers 20 on which different types of memory chips 21 (memory bodies 211, 212, 213, and 214) are disposed are stacked on the logic chip 11.

Next, the dicing position determining step includes determining dicing positions of the logic wafer 10 and the memory wafers 20. In the dicing position determining step, for example, among the adjacent memory bodies 211, 212, 213 and 214, the dicing position is determined according to the number of memory bodies 211, 212, 213 and 214 to be included in one stacked semiconductor 1. The dicing position is usually determined based on the size of one of the logic chip 11; however, the dicing position may be determined based on the size of a plurality of logic chip 11 serving as the stacked semiconductor 1.

Next, the dicing execution step includes dicing the determined dicing position. Thus, the stacked semiconductor 1 is manufactured.

The stacked semiconductor 1 and the wafer stack 100 described above achieve the following advantageous effects.

(1) The stacked semiconductor 1 including a stack of a plurality of chips includes: the logic chip 11; and the memory unit 22 stacked on the logic chip 11 and including the at least one memory chip 21 that is communicable with the logic chip 11, in which the memory chip 21 includes at least two memory bodies 211, 212, 213 and 214, each having a memory circuit and provided in parallel in a direction intersecting the stacking direction, and the connecting portion 50 provided between the memory bodies 211, 212, 213 and 214 in a predetermined width and connecting the memory bodies 211, 212, 213, and 214 provided in parallel. This eliminates the need to stack the memory chips 21 by a number of times needed for each device. Therefore, it is possible to reduce the manufacturing cost of the stacked semiconductor 1.

(2) The stacked semiconductor 1 further includes the communication unit 30 provided across the logic chip 11 and the memory chip 21 in the stacking direction. Furthermore, the plurality of memory chips 21 are stacked such that the memory bodies 211, 212, 213 and 214 provided in parallel of the memory chip 21 are superimposed on memory bodies 211, 212, 213 and 214 of one other memory chip 21 in the stacking direction, and the communication unit 30 is provided in an aligned manner in the stacking direction in each of the logic chip 11 and the plurality of memory bodies 211, 212, 213 and 214. Furthermore, the plurality of memory chips 21 include the first memory chip 21a including first memory bodies 211a, 212a, 213a and 214a of a predetermined type, and the second memory chip 21b including the second memory bodies 211b, 212b, 213b and 214b of a type different from that of the first memory chip 21a, and the communication unit 30 includes the first communication unit 31 provided in the logic chip 11 and the first memory bodies 211a, 212a, 213a and 214a, and the second communication unit 32 provided in the logic chip 11 and the second memory bodies 211b, 212b, 213b and 214b. Furthermore, the first communication unit 31 is provided at a position different from that of the second communication unit 32 in a direction intersecting the stacking direction. Thus, even if different types of chips are used, communication can be performed separately.

(3) Each of the memory bodies 211, 212, 213 and 214 is identical in type with other of the memory bodies 211, 212, 213 and 214 provided in parallel. Furthermore, each of the memory bodies 211, 212, 213 and 214 is different in type from the other memory bodies 211, 212, 213 and 214 to be stacked. As a result, it is possible for the stacked semiconductor 1 to have many variations.

(4) The logic chip 11 and the memory chip 21 respectively include power supplies 40 provided in a superimposed manner. Since the power supply unit 40 can be shared, it is possible to further reduce the cost.

(5) A method of manufacturing the stacked semiconductor 1 including a stack of a plurality of chips includes: the stacking step including stacking the memory wafers 20 each including the plurality of memory bodies 211, 212, 213 and 214 arranged in a matrix, and the plurality of logic chips 11 that are arranged in a matrix and are respectively superimposed on the memory bodies 211, 212, 213 and 214 to form the wafer stack; the partition determination step including determining a memory partition including a combination of at least two memory bodies 211, 212, 213 and 214 among the memory bodies and one logic chip 11 among the logic chips; and a dicing step including dicing the wafer stack according to the memory partition determined. Thus, since it is not necessary to stack the number of memory bodies 211, 212, 213 and 214 required for each stacked semiconductor 1 while aligning them, it is possible to reduce the manufacturing cost.

(6) The wafer stack 100 includes: the logic wafer 10 including the logic chips 11 arranged in a matrix; and the memory wafers 20 each including the memory bodies 211, 212, 213 and 214 arranged in a matrix, and stacked on the logic wafer 10. As a result, since the logic chip 11 and the memory bodies 211, 212, 213 and 214 can be aligned before dicing, it is possible to reduce the manufacturing cost.

Second Embodiment

Figure 11:
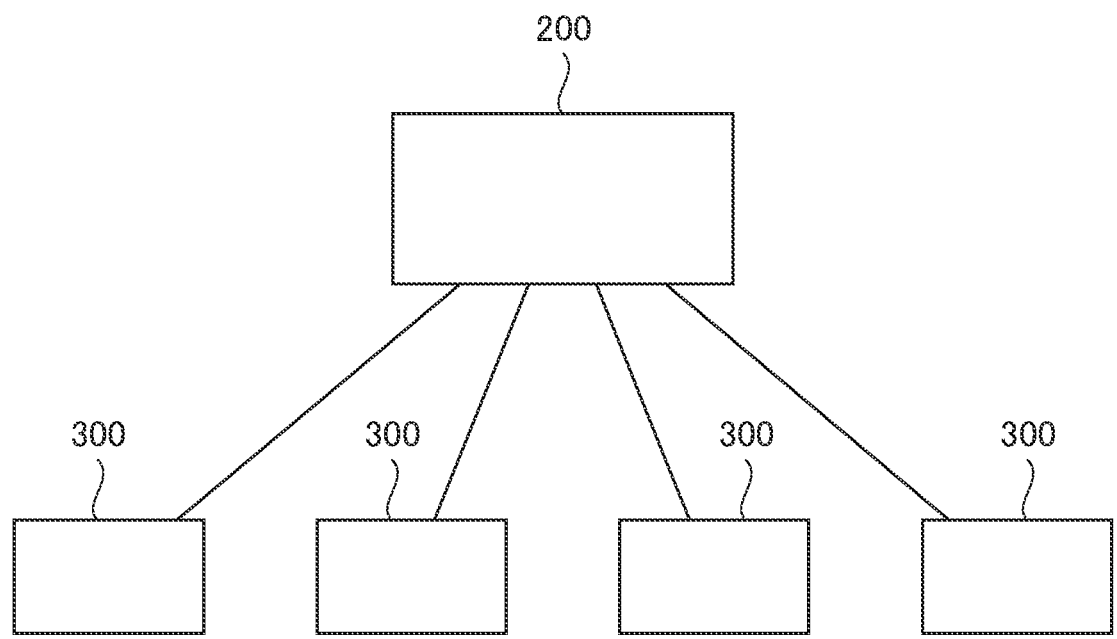
FIG. 11 is a schematic configuration diagram showing an assistance device according to a second embodiment of the present invention.
Figure 12:
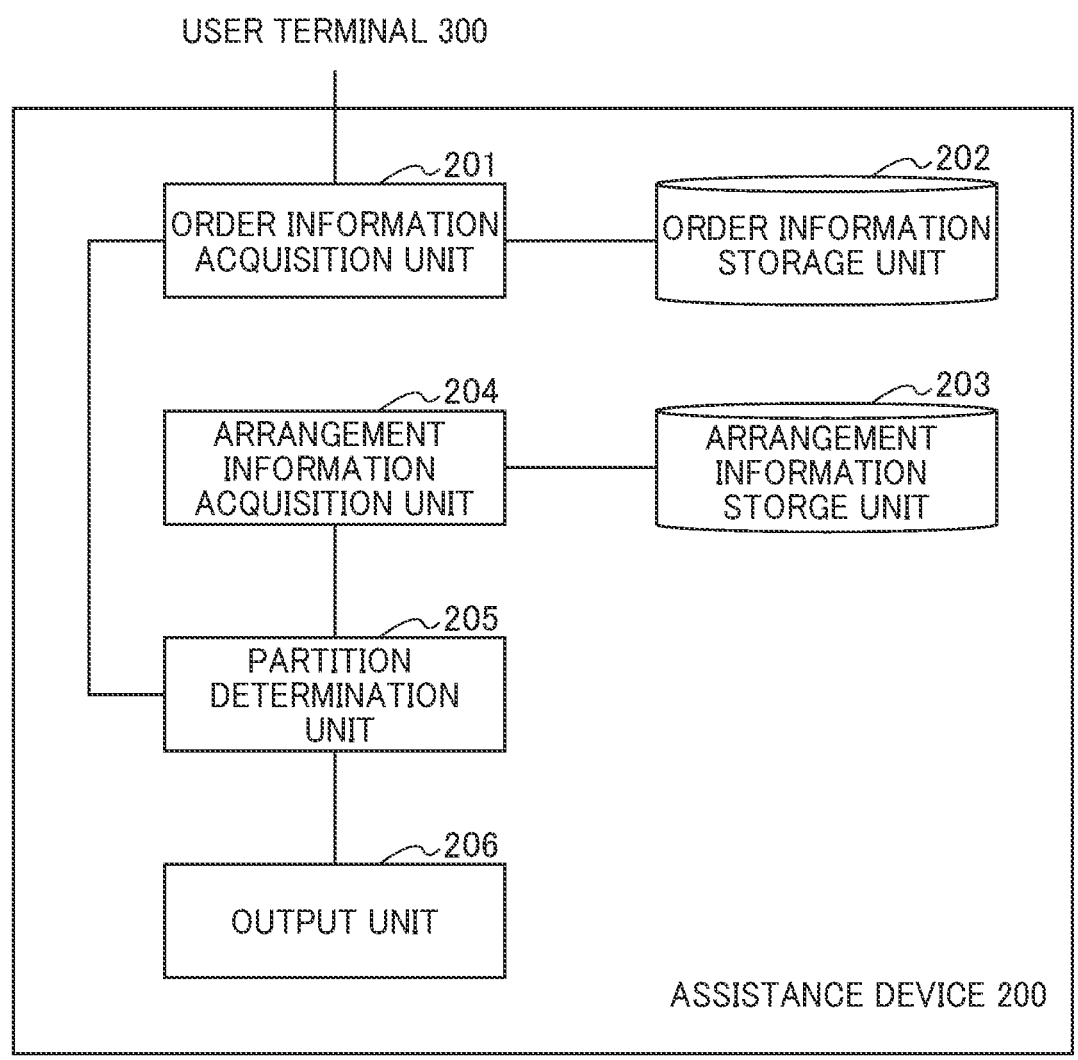
FIG. 12 is a block diagram showing an assistance device according to the second embodiment.

Next, an assistance device 200 and a program according to a second embodiment of the present invention will be described with reference to FIGS. 11 and 12. In the description of the second embodiment, the same components as those of the above-described embodiment are denoted by the same reference numerals, and the description thereof is omitted or simplified. First, an outline of the assistance device 200 and the program according to the second embodiment will be described.

An LSI prototyping services called "multi-project wafer service" or "shuttle service" has been known. This service allows multiple customers to share a single wafer for using LSI. Thus, it is possible to reduce the cost of the LSI prototyping service.

In this service, LSI is prototyped using a logic process. Therefore, this service has a problem in that it is difficult to prototype a system LSI using large-capacity memory or large-capacity and high-speed memory. In addition, a prototyping service for three-dimensional LSI has not been provided. The assistance device 200 and the program according to the present embodiment are directed to an assistance device 200 in manufacturing the stacked semiconductor 1 in the shuttle service.

The assistance device 200 is, for example, a server. As shown in FIG. 11, the assistance device 200 is communicably connected to a user terminal 300. The assistance device 200 executes assistance for dividing the wafer stack 100 in which the memory wafers 20 and the logic wafer 10 are stacked, into the plurality of stacked semiconductors 1 in accordance with a plurality of orders obtained. The memory wafers 20 each include the plurality of memory bodies 211, 212, 213 and 214 arranged in a matrix. The logic wafer 10 includes the plurality of logic chips 11 which are arranged in a matrix, and are arranged in a superimposed manner on the memory bodies 211, 212, 213 and 214, respectively according to a plurality of orders acquired. As shown in FIG. 12, the assistance device 200 includes an order information acquisition unit 201, an order information storage unit 202, an arrangement information storage unit 203, an arrangement information acquisition unit 204, a partition determination unit 205, and an output unit 206.

The order information acquisition unit 201 is realized, for example, by operating the CPU. The order information acquisition unit 201 acquires a plurality of sets of order information including the number of the memory bodies 211, 212, 213 and 214. The order information acquisition unit 201 acquires, as order information, information such as the number (capacity) of the memory bodies 211, 212, 213 and 214 of the stacked semiconductor 1 to be manufactured, the type of memory, and the like, from the user terminal 300, for example.

The order information storage unit 202 is, for example, a secondary storage medium such as a hard disk. The order information storage unit 202 stores the acquired order information.

The arrangement information storage unit 203 is, for example, a secondary storage medium such as a hard disk. The arrangement information storage unit 203 stores arrangement information indicating arrangement positions of the memory bodies 211, 212, 213 and 214.

The arrangement information acquisition unit 204 is realized, for example, by operating the CPU. The arrangement information acquisition unit 204 acquires arrangement information indicating the arrangement positions of the memory bodies 211, 212, 213 and 214. In the present embodiment, the arrangement information acquisition unit 204 acquires arrangement information from the arrangement information storage unit 203.

The partition determination unit 205 is realized by, for example, operating a CPU. The partition determination unit 205 determines the partitions of the memory chip 21 including the plurality of memory bodies 211, 212, 213, and 214, and the logic chip 11 based on the acquired order information and the arrangement information. For example, the partition determination unit 205 determines the partition by assigning the memory bodies 211, 212, 213 and 214 to the order information with respect to the memory chip 21 disposed on the memory wafer 20. Furthermore, the partition determination unit 205 may determine the section in consideration of the size of the reticle.

The output unit 206 is, for example, an output device such as a display. The output unit 206 outputs the determined partition.

Next, operation of the assistance device will be described. The order information acquisition unit 201 acquires order information from the user terminal 300. The order information acquisition unit 201 stores the acquired order information in the order information storage unit 202.

Next, in the case of determining a partition, the partition determination unit 205 reads order information from the order information storage unit 202 via the order information acquisition unit 201. In addition, the arrangement information acquisition unit 204 acquires arrangement information from the arrangement information storage unit 203. The arrangement information acquisition unit 204 sends the acquired arrangement information to the partition determination unit 205.

The partition determination unit 205 determines a section of the stacked semiconductor from the order information and the arrangement information. The partition determination unit 205 determines the partition of the memory chip 21 based on, for example, the number of the memory bodies 211, 212, 213 and 214 included in the order information. The output unit 206 outputs the determined partition to the outside.

Next, the program will be described. Each configuration included in the assistance device 200 may be implemented in hardware, software, or a combination thereof, respectively. Here, the implementation by software indicates that the computer is implemented by reading and executing programs.

Programs can be stored using various types of non-transitory computer readable medium and supplied to a computer. The non-transitory computer-readable media include various types of tangible storage medium. Examples of the non-transitory computer-readable media include magnetic recording media (e.g., flexible disks, magnetic tapes, hard disk drives), magnetic-optical recording media (e.g., magnetic optical disks), CD-ROM (Read Only Memory), CD-R, CD-R/W, solid-state memory (e.g., mask ROM, PROM (Programmable ROM), EPROM (Erasable PROM), flash ROM, SSD (Solid State Drive), and RAM (random access memory)). Furthermore, the programs may also be supplied to a computer by various types of transitory computer-readable medium. Examples of the transitory computer readable media include electrical signals, optical signals, and electromagnetic waves. The transitory computer readable medium may provide the programs to the computer via wired or wireless communication paths, such as electrical wires and optical fibers.

The assistance device 200 and the program according to the present embodiment have the following advantageous effects.

(7) The assistance device 200 includes: the order information acquisition unit 201 that acquires a plurality of pieces of order information including a number of the memory bodies 211, 212, 213 and 214; the arrangement information acquisition unit 204 that acquires arrangement information indicating arrangement positions of the memory bodies 211, 212, 213 and 214; and the partition determination unit 205 that determines partitions of memory chips 21 including the plurality of memory bodies2ll, 212, 213 and 214 and the logic chip 11 based on the order information and the arrangement information acquired. As a result, it is possible to collect the order information obtained from the user to determine a section for manufacturing the stacked semiconductor 1. Therefore, it is possible to configure a partition in which orders of a plurality of users are optimized, and it is possible to reduce the manufacturing cost.

Although the preferred embodiments of the stacked semiconductor 1, the wafer stack 100, the assistance device 200, and the program of the present invention have been described above, the present invention is not limited to the above-described embodiments, and can be modified as appropriate. For example, in the embodiments described above, regarding the type of the memory wafers 20 to be stacked on the logic wafer, the memory wafers 20 in which the three types of memory chips 21 are respectively arranged are stacked; however, the present invention is not limited thereto. For example, two or more wafers on which memory chips 21 of the same type are arranged may be stacked. In this case, the communication unit 30 may be shared by two or more wafers on which the memory bodies 211, 212, 213 and 214 of the same type are arranged. For example, a plurality of first memory bodies 211a, 212a, 213a and 214a may be provided, and the first communication unit 31 may be disposed between the logic chip 11 and the plurality of first memory bodies 211a, 212a, 213a and 214a and shared by the plurality of first memory bodies 211a, 212a, 213a and 214a.

In the above-described embodiments, the assistance device 200 may further include a memory type determination unit (not shown) that determines the types of the stacked memory bodies 211, 212, 213, and 214 in advance. For example, the memory type determination unit may transmit the memory type to be stacked on the wafer stack 100 to be manufactured next, to the user terminal 300 in order to receive an order from the user. Furthermore, the order information acquisition unit 201 may acquire the order information including the memory type from the user terminal 300. The partition determination unit 205 may determine partitions of the wafer stack 100 that matches the order information for each user having the same memory type.

Figure 13:
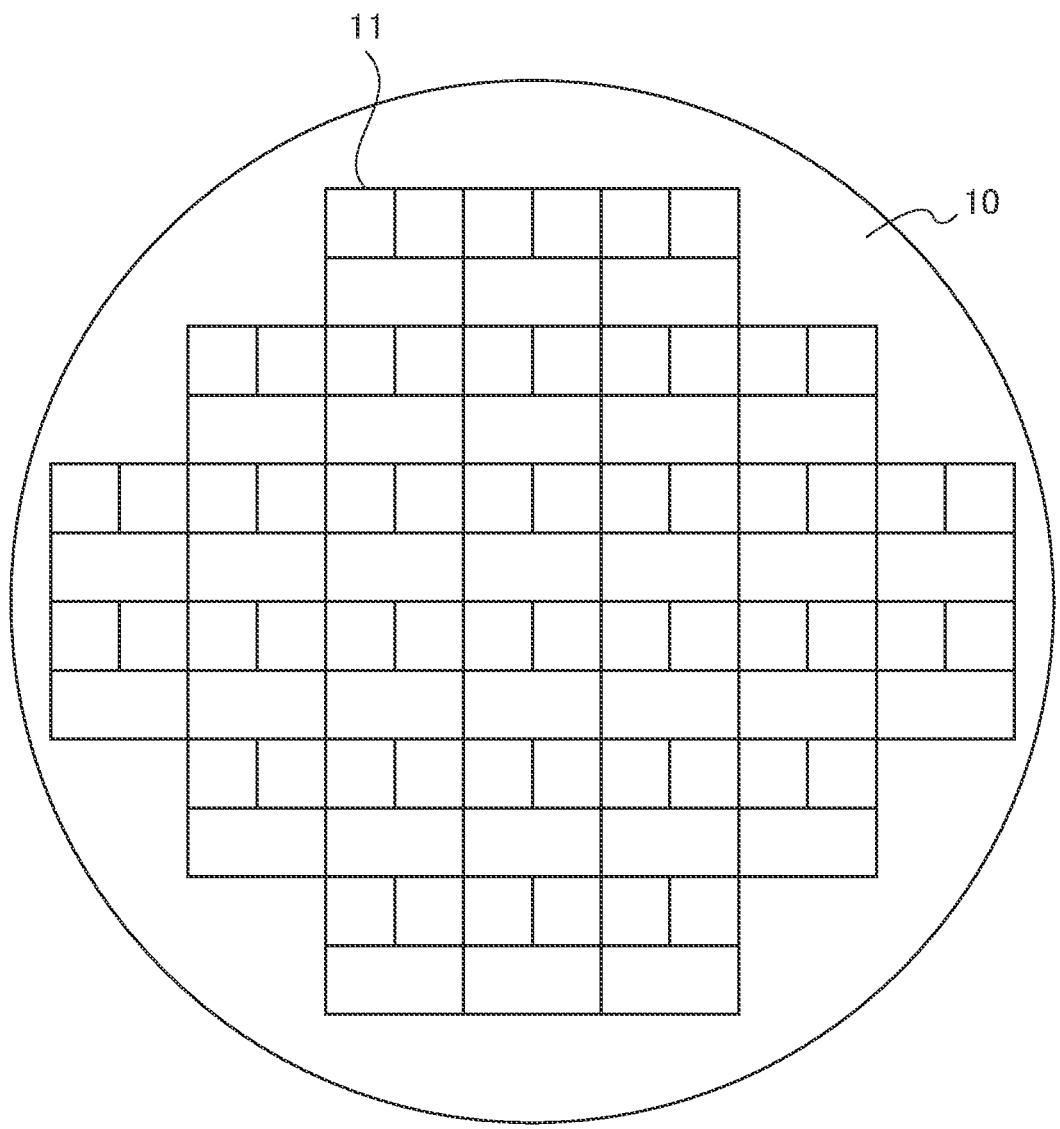
FIG. 13 is a plan view showing a logic wafer of a modification example.
Figure 14:
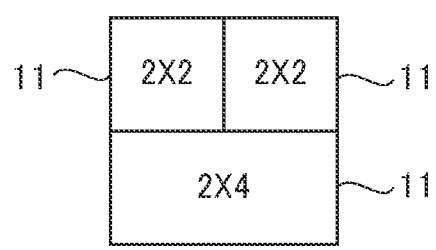
FIG. 14 is a plan view showing an arrangement of a stacked semiconductor of the modification example.

Furthermore, in the above-described embodiments, sixteen memory bodies 211, 212, 213 and 214 of 1×1 size (unit size) are arranged in one reticle, and distributed to four logic chips 11 of four; however, the present invention is not limited to this. For example, as shown in FIGS. 13 and 14, two logic chips 11 of 2×2 size and one logic chip 11 of 2×4 size may be arranged in one reticle. FIG. 15 exemplifies the relationship between the size of the logic chip 11, the number of arranged memory chips 12 corresponding to the chip area (Foot Print), the number of stacks, and the memory capacities. In FIG. 15, four numerical values are described in the column of one memory capacity, which corresponds to the memory body in which the memory capacity of the unit size differs, and are 2 Gb, 1.5 Gb, 0.6 Gb, 64 Gb in order from left to right. The memory capacities are, for example, DRAM prioritizing the memory capacity, DRAM prioritizing the bandwidth, DRAM prioritizing the access time, and NAND flash memory.

In the above embodiments, the type or size of each of the logic chips 11 on the logic wafer 10 may be different. Furthermore, in the above embodiments, laser dicing or plasma dicing may be used for dicing.

EXPLANATION OF REFERENCE NUMERALS 1 stacked semiconductor
10 logic wafer
11 logic chip
20 memory wafer
21 memory chip
21a first memory chip
21b second memory chip
21c third memory chip
22 memory unit
30 communication unit
31 first communication unit
32 second communication unit
33 third communication unit
40 power supply
50 connecting portion
100 wafer stack
200 assistance device
201 order information acquisition unit
202 order information storage unit
203 arrangement information storage unit
204 arrangement information acquisition section
205 partition determination unit
206 output unit
211a, 212a, 213a, 214a first memory bodies
211b, 212b, 213b, 214b second memory bodies
211c, 212c, 213c, 214c third memory bodies
300 user terminal

The invention claimed is:

1. A stacked semiconductor including a stack of a plurality of chips, the stacked semiconductor comprising:
a logic chip; and
a memory unit stacked on the logic chip and including at least one memory chip that is communicable with the logic chip,
wherein the memory chip includes:
at least two memory bodies, each having a memory circuit and provided in parallel in a direction intersecting a stacking direction, and
a connecting portion provided between the memory bodies in a predetermined width and connecting the memory bodies provided in parallel,
wherein the stacked semiconductor further comprises a communication unit provided across the logic chip and the memory chip in the stacking direction,
wherein the memory chip further comprises a plurality of memory chips, and the plurality of memory chips are stacked such that the memory bodies provided in parallel of the memory chip are superimposed on memory bodies of one other memory chip in the stacking direction, and
the communication unit is provided in an aligned manner in the stacking direction in each of the logic chip and the plurality of memory bodies.

2. The stacked semiconductor according to claim 1, wherein each of the memory bodies is identical in type with other of the memory bodies provided in parallel.

3. The stacked semiconductor according to claim 1, wherein each of the memory bodies is different in type from the other memory bodies to be stacked.

4. The stacked semiconductor according to claim 1, wherein
the plurality of memory chips include:
a first memory chip including a first memory body of a predetermined type, and
a second memory chip including a second memory body of a type different from that of the first memory chip, and
The communication unit includes:
a first communication unit provided in the logic chip and the first memory body, and
a second communication unit provided in the logic chip and the second memory body.

5. The stacked semiconductor according to claim 4, wherein the first communication unit is provided at a position different from that of the second communication unit in a direction intersecting the stacking direction.

6. The stacked semiconductor according to claim 1, wherein the logic chip and the memory chip respectively include power supplies provided in a superimposed manner.

7. A wafer stack comprising:
a logic wafer including logic chips according to claim 1 arranged in a matrix; and
memory wafers each including the memory bodies arranged in a matrix, and stacked on the logic wafer.

8. A method of manufacturing a stacked semiconductor including a stack of a plurality of chips, comprising:
a stacking step including stacking memory wafers each including a plurality of memory bodies arranged in a matrix, and a logic wafer including a plurality of logic chips that are arranged in a matrix and are respectively superimposed on the memory bodies, to form a wafer stack;
a partition determination step including determining a memory partition including a combination of at least two memory bodies among the memory bodies and one logic chip among the logic chips; and
a dicing step including dicing the wafer stack according to the memory partition determined.

9. The method of manufacturing a stacked semiconductor according to claim 8, wherein the stacking step further includes stacking a plurality of memory wafers, each including the memory body of different type provided therein.

10. An assistance device that executes assistance for dividing a wafer stack in which memory wafers including a plurality of memory bodies arranged in a matrix, and a logic wafer including a plurality of logic chips arranged in a matrix provided therein and arranged in a superimposed manner on the memory bodies, respectively, according to a plurality of orders acquired, the assistance device comprising:
an order information acquisition unit that acquires a plurality of pieces of order information including a number of the memory bodies;
an arrangement information acquisition unit that acquires arrangement information indicating arrangement positions of the memory bodies; and
a partition determination unit that determines partitions of memory chips including the plurality of memory bodies and the logic chip based on the order information and the arrangement information acquired.

11. A non-transitory computer-readable storage medium storing a program that is executed by a computer that comprises a processor to control an assistance device that executes assistance for dividing a wafer stack in which memory wafers including a plurality of memory bodies arranged in a matrix, and a logic wafer including a plurality of logic chips arranged in a matrix provided therein and arranged in a superimposed manner on the memory bodies, respectively, according to a plurality of orders acquired, the program being executable to cause the computer to perform operations comprising:
an order information acquisition unit that acquires a plurality of pieces of order information including a number of the memory bodies;
an arrangement information acquisition unit that acquires arrangement information indicating arrangement positions of the memory bodies; and
a partition determination unit that determines partitions of memory chips including the plurality of memory bodies and the logic chip based on the order information and the arrangement information acquired.

* * * * *